United States Patent
Sakata

(10) Patent No.: US 7,920,613 B2
(45) Date of Patent: Apr. 5, 2011

(54) OPTICAL SEMICONDUCTOR DEVICE AND METHOD OF MANUFACTURING SAME

(75) Inventor: Yasutaka Sakata, Kanagawa (JP)

(73) Assignee: Renesas Electronic Corporation, Kanagawa (JP)

(*) Notice: Subject to any disclaimer, the term of this patent is extended or adjusted under 35 U.S.C. 154(b) by 313 days.

(21) Appl. No.: 12/245,780

(22) Filed: Oct. 6, 2008

(65) Prior Publication Data

US 2009/0092164 A1 Apr. 9, 2009

(30) Foreign Application Priority Data

Oct. 5, 2007 (JP) ................................. 2007-262253

(51) Int. Cl.
*H01S 5/00* (2006.01)
(52) U.S. Cl. .............. 372/45.01; 372/46.01; 372/46.015
(58) Field of Classification Search ............... 372/45.01, 372/46.01, 46.015
See application file for complete search history.

(56) References Cited

U.S. PATENT DOCUMENTS

| | | | | |
|---|---|---|---|---|
| 2007/0153857 A1* | 7/2007 | Chua et al. | ................ | 372/49.01 |
| 2008/0013579 A1* | 1/2008 | Matsuda et al. | ........... | 372/43.01 |

FOREIGN PATENT DOCUMENTS

| | | | |
|---|---|---|---|
| JP | 2002-026458 | | 1/2002 |
| JP | 2002026458 A | * | 1/2002 |
| JP | 2007-103581 | | 4/2007 |

OTHER PUBLICATIONS

Ikeqami, Tsuchiya, Mikami, "Semiconductor Photonic Device Engineering", Corona Publishing Co., LTd., Jan. 10, 1005.

* cited by examiner

*Primary Examiner* — Minsun Harvey
*Assistant Examiner* — Patrick Stafford
(74) *Attorney, Agent, or Firm* — Young & Thompson

(57) ABSTRACT

The reliability of a buried hetero-structure semiconductor laser is improved by preventing an increase in oscillation threshold current and a decrease in external differential quantum efficiency in cases where the semiconductor laser is energized continuously under conditions of high temperature and high optical output. An optical semiconductor laser has an optical waveguide structure comprising an n-type cladding layer, an active layer and p-type cladding layers, and a current narrowing/blocking structure comprising a p-type blocking layer and an n-type blocking layer, wherein concentration of hydrogen contained in the p-type cladding layers is higher than concentration of hydrogen contained in the p-type blocking layer.

3 Claims, 14 Drawing Sheets

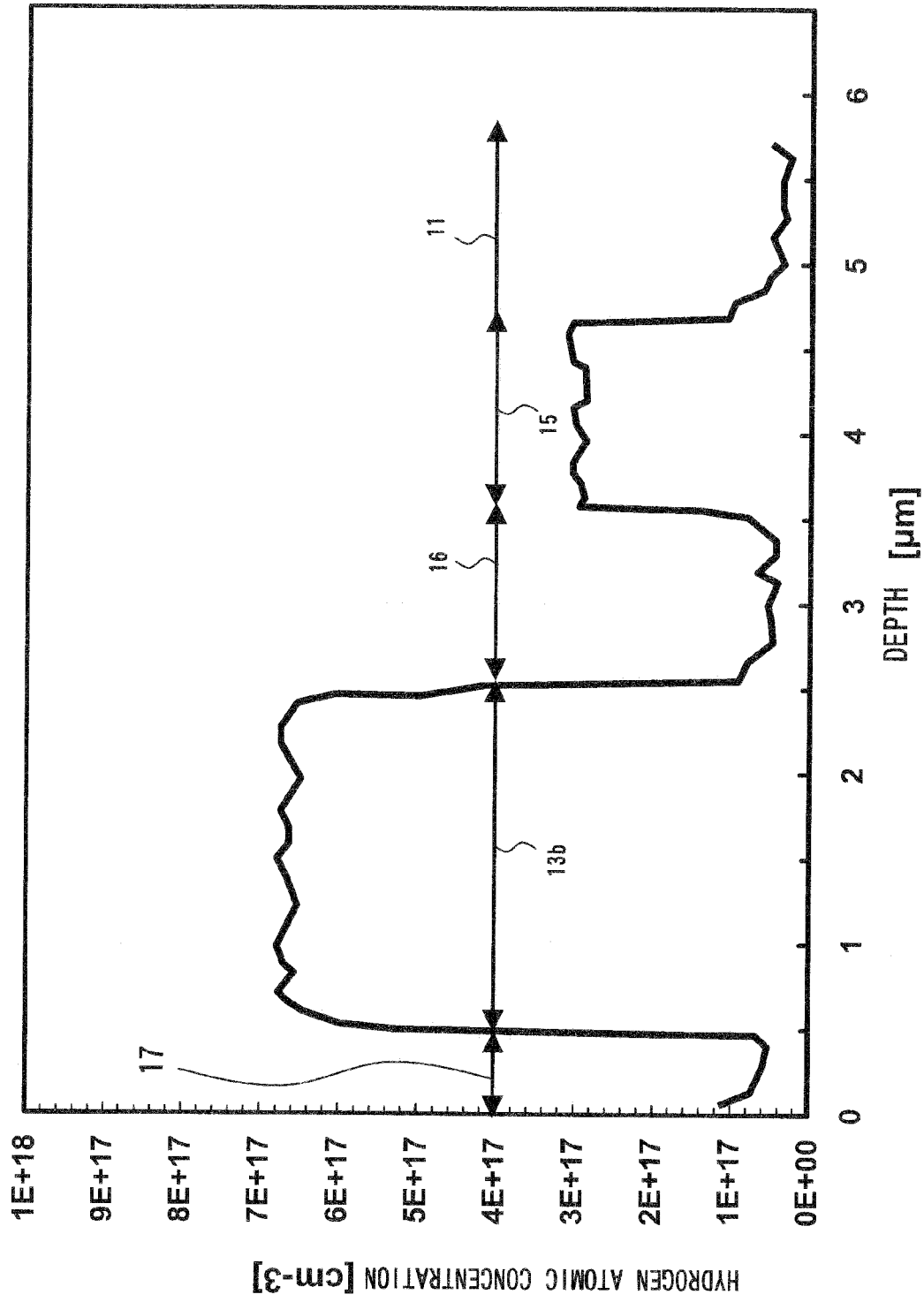

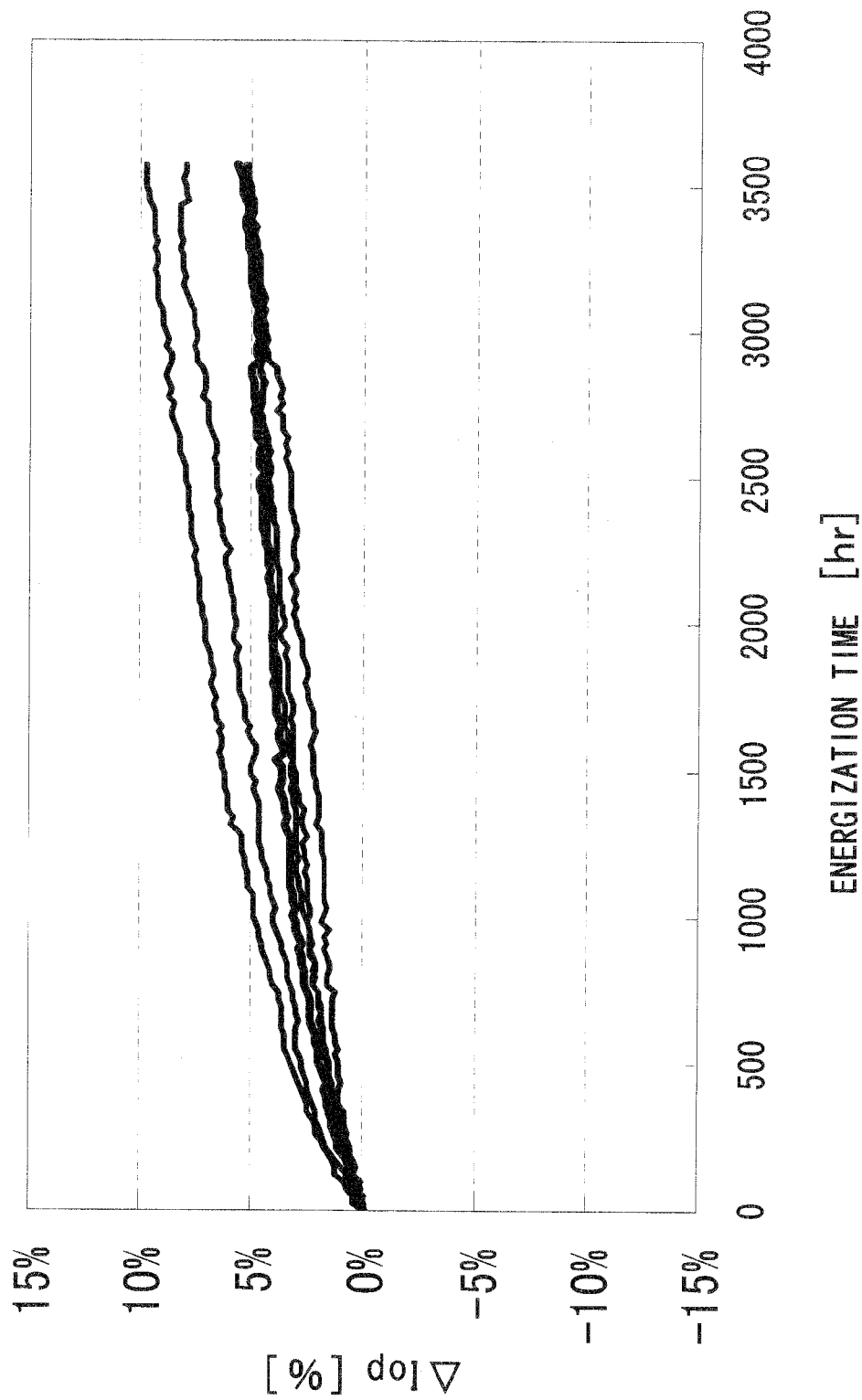
FIG. 14 COMPARATIVE

OPTICAL SEMICONDUCTOR DEVICE AND METHOD OF MANUFACTURING SAME

REFERENCE TO RELATED APPLICATION

This application is based upon and claims the benefit of the priority of Japanese patent application No. 2007-262253, filed on Oct. 5, 2007, the disclosure of which is incorporated herein in its entirety by reference thereto.

TECHNICAL FIELD

This invention relates to an optical semiconductor device and method of manufacturing the same. More particularly, the invention relates to a buried semiconductor laser and method of manufacturing the same.

BACKGROUND

The smooth development of the Internet, which has expanded at a rapid pace, is being sustained by an increase in the capacity of communications by virtue of optical fiber. The scope of application of optical fiber communication networks has broadened to include not only trunk line systems but also access systems and subscriber systems. Inexpensive semiconductor lasers capable of withstanding high-temperature operation are in demand particularly in FFTH (Fiber-To-The-Home), a system in which optical fiber is connected to the home of each subscriber. In semiconductor lasers for optical subscriber systems, achieving a low oscillation threshold current, a low driving current and a low driving voltage is essential for the purpose of reducing power consumption, and a BH (Buried Hetero) structure generally is employed. In particular, a PBH (Planar Buried Hetero) laser in which a pnpn thyristor layer is adopted as a current narrowing/blocking structure and both sides of the light-emitting portion are buried is in wide use in order to reduce leakage current (reactive current).

As an example, reference will be had to the drawings to describe the structure and method of manufacturing a buried semiconductor laser on an InP substrate according to the conventional art, which is set forth in Patent Document 1 and Non-Patent Document 2.

FIGS. 10A-10D is a diagram useful in describing a method of manufacturing a conventional semiconductor laser, and FIG. 11 is a perspective view of the semiconductor laser.

First, an active layer 22 comprising InGaAsP or the like and a p-type InP cladding layer 23a are grown epitaxially on an n-type InP substrate 21 successively (FIG. 10A). Next, a dielectric mask 24 comprising $SiO_2$ or the like is formed in the shape of a stripe on the p-type InP cladding layer 23a and, using this as a mask, the p-type InP cladding layer 23a, active layer 22 and n-type InP substrate 21 are etched into a mesa stripe (FIG. 10B). A current narrowing/blocking structure comprising a p-type InP blocking layer (buried layer) 25 and n-type InP blocking layer 26 is then grown burying the sides of the mesa stripe (FIG. 10C). After the dielectric mask 24 is removed, a p-type InP over-cladding layer 23b and a p-type InGaAs contact layer 27 are grown epitaxially (FIG. 10D).

By subjecting the wafer (FIG. 10D) that has thus undergone epitaxial crystal growth to an electrode formation process for a p-side electrode 28 and n-side electrode 29, the semiconductor laser of FIG. 11 is obtained.

In general, Zn on the order of $1 \times 10^{18}$ $cm^{-3}$ is used as the dopant (acceptor) in the p-type InP blocking layer 25 and p-type InP over-cladding layer 23b, and Si on the order of $1 \times 10^{18}$ $cm^{-3}$ is used as the dopant (donor) in the n-type InP blocking layer 26.

It should be noted that Patent Document 2 discloses a method of manufacturing a semiconductor laser in which a rise in resistance of a cladding layer due to diffusion of hydrogen is prevented while the introduction of a Group-V defect in the cladding layer and active layer is prevented by carrying out a temperature lowering process, which follows the formation of a heterostructure, in an atmosphere that includes a hydrogen-containing compound serving as a Group-V raw material and carrying out a temperature lowering process, which follows the formation of a p-type contact layer, in an atmosphere that does not include a hydrogen-containing compound serving as a Group-V raw material.

[Patent Document 1]
Japanese Patent Kokai Publication No. JP-2007-103581A (FIG. 1)

[Patent Document 2]
Japanese Patent Kokai Publication No. JP-P2002-26458A

[Non-Patent Document 1]
Ikegami, Tsuchiya, Mikami, "Semiconductor Photonic Device Engineering", Corona Publishing Co., Ltd., Jan. 10, 1995, pp. 202-203

SUMMARY OF THE DISCLOSURE

The entire disclosures of Patent Documents 1 and 2 and Non-Patent Document 1 are incorporated herein by reference thereto. The following analyses are given by the present invention.

The analysis set forth below has been performed by the present inventors.

A problem set forth below arises in a case where the conventional PBH laser is used in an application that requires operation at high temperature and high optical output as in the manner of FTTH.

Specifically, in a case where a conventional PBH laser is operated continuously at a high temperature and a high optical output, an increase in oscillation threshold current and a decrease in external differential quantum efficiency occur and operating current increases. Since the lifetime of a semiconductor laser is decided by the rate of increase in operating current, the operating conditions mentioned above lead to a shorter lifetime for the semiconductor lasers. Since InGaAsP/InP-group semiconductor lasers that have come to be used in telecommunications are employed upon being temperature-adjusted to about room temperature (20 to 30 degrees C.), any increase in operating current has been negligible. However, semiconductor lasers used in FTTH applications are required to be driven continuously at high temperatures of 85 to 95 degrees C. or greater and at high outputs of 10 mW or greater. Under such high temperatures and high output power, shortening of lifetime due to an increase in operating current can be a serious problem.

Accordingly, it is an object of the present invention to improve the reliability of a buried semiconductor laser by preventing an increase in oscillation threshold current and a decrease in external differential quantum efficiency, which occur when the semiconductor laser is driven under conditions of high temperature and bias.

A semiconductor laser (or optical semiconductor device) according to the present invention has an optical waveguide structure comprising at least an n-type cladding layer, an active layer and a p-type cladding layer, and a current narrowing/blocking structure comprising a p-type blocking layer and an n-type blocking layer, wherein concentration of hydrogen contained in the p-type cladding layer is higher than the concentration of hydrogen contained in the p-type blocking layer.

Further, it is preferred that the concentration of hydrogen contained in the p-type cladding layer be two or more times greater than the concentration of hydrogen contained in the p-type blocking layer.

The Inventors have clarified the mechanism whereby an increase in oscillation threshold current and a decrease in external differential quantum efficiency occur in a case where a PBH laser is operated continuously under conditions of high temperature and high output power. This mechanism will now be described while referring to the cross-sectional structure of a PBH-type semiconductor laser in FIG. 3.

Metal-Organic Vapor Phase Epitaxy (MOVPE) is used to achieve crystal growth in a laser structure. At the time of crystal growth of a p-type InP current blocking layer 15 and a p-type InP cladding layer 13b, hydrogen that evolves from phosphine (PH3), which is a decomposed Group-V raw-material gas, is taken in and remains in the crystal even after crystal growth. It is known that hydrogen (H) in the p-type semiconductor layers compensates for the acceptor (this is referred to as "hydrogen passivation") and lowers the carrier concentration (acceptor concentration) of the p-type semiconductor. Further, since the hydrogen in the p-type semiconductor is stable in the state of $H^+$, migration of hydrogen of the kind shown by arrows in FIG. 3 occurs when a current is passed under conditions of high temperature and high bias (forward bias).

A first hydrogen migration path is path "a" from the p-type InP blocking layer 15 to the an n-type InP substrate 11, and a second path is a path "b" from the p-type InP cladding layer 13b to the p-type InP blocking layer 15.

When migration of hydrogen on path "a" occurs, acceptor compensation (hydrogen passivation) of the p-type InP blocking layer 15 is suppressed and the carrier concentration of the p-type InP blocking layer 15 rises (resistance lowers) in comparison with that before conduction of current. When migration of hydrogen on path "b" occurs, on the other hand, acceptor compensation (hydrogen passivation) of the p-type InP blocking layer 15 is promoted and, as a result, the carrier concentration of the p-type InP blocking layer 15 falls (resistance rises) in comparison with that before conduction of current.

If the carrier concentration of the p-type InP blocking layer 15 is high (the resistance is low), leakage current in a state before reaching the laser oscillation threshold value increases. Consequently, the oscillation threshold current rises. Conversely, if the carrier concentration of the p-type InP blocking layer 15 is low (the resistance is high), then the leakage current in the state before reaching the laser oscillation threshold is suppressed. As a result, the oscillation threshold current decreases.

Accordingly, the oscillation threshold current increases or decreases depending upon whether the amount of change in concentration of hydrogen in the p-type InP blocking layer 15 before and after conduction of current is positive or negative. That is, an increase or decrease in oscillation threshold current is decided depending on in which path, a or b, the migration of hydrogen ($H^+$) illustrated in FIG. 3 is greater.

Generally, in a PBH laser, the current-blocking breakdown voltage of the pnpn thyristor structure is elevated by raising the doping concentration in the p-type InP blocking layer 15 within limits that will not have an adverse effect upon the initial characteristics of the laser. On the other hand, by keeping the doping concentration in the p-type InP cladding layer 13b low within limits that will not cause an excessive rise in resistance, light-absorption loss is suppressed and optical output is increased, in general.

As a result, the following holds for the carrier concentration of the p-type layers: [p-type InP blocking layer 15]≧[p-type InP cladding layer 13b], and the following also holds for the concentration of hydrogen ($H^+$) that compensates for the p-type carrier (acceptor): [p-type InP blocking layer 15]≧[p-type InP cladding layer 13b]. This means that the amount of migration of hydrogen ($H^+$) due to conduction (passage) of current is greater for path "a" than for path "b". Consequently, when a current is passed under conditions of high temperature and high bias (high optical output), the oscillation threshold current rises and this rise is accompanied by a decline in the external differential quantum efficiency.

Thus, the mechanism whereby oscillation threshold current increases and external differential quantum efficiency declines in a case where a PBH laser is energized under conditions of high temperature and high bias is as set forth above.

The meritorious effects of the present invention are summarized as follows.

With the optical semiconductor device according to the present invention, an increase in threshold current and a decline in external differential quantum efficiency (a rise in operating current) can be prevented even in a state of high temperature and high optical output drive, and reliability under operating conditions of high temperature and high output can be improved.

The reason for this is as follows: When a buried heterostructure semiconductor laser having a pn current narrowing/blocking structure is energized in order to be driven under high temperature and high optical output, the hydrogen that remains in the p-type semiconductor layers (the p-type cladding layer 13b and p-type blocking layer 15) migrates toward the side of the n-type substrate 11. When the hydrogen in the p-type blocking layer 15 migrates toward the side of the n-type cladding layer (n-type substrate) 11, as on path "a" in FIG. 3, acceptor compensation (hydrogen passivation) ascribable to residual hydrogen is suppressed and the carrier concentration of the p-type blocking layer 15 rises. On the other hand, since the hydrogen in the p-type cladding layer 13b migrates toward the side of the p-type blocking layer 15, as on path "b" in FIG. 3, acceptor compensation (hydrogen passivation) ascribable to hydrogen in the p-type blocking layer 15 is promoted. Accordingly, paths "a" and "b" have opposite effects upon a change in the carrier concentration of the p-type blocking layer 15.

In the optical semiconductor device according to the present invention, the concentration of hydrogen contained in the p-type cladding layer 13b is higher than the concentration of hydrogen contained in the p-type blocking layer 15. As a result, the amount of migration of hydrogen ions through the path "b" in FIG. 3 becomes relatively large and a rise in the carrier concentration of the p-type blocking layer 15 due to conduction (passage) of current can be prevented.

In particular, in a case where the hydrogen concentration of the p-type cladding layer 13b is made two or more times greater than the hydrogen concentration of the p-type blocking layer 15, the effect of reducing the oscillation threshold current by conduction of current becomes more pronounced and the reliability of the optical semiconductor device can be improved further.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 9 is a hydrogen concentration profile in the optical semiconductor device according to the second example;

FIG. 14 illustrates the result of an APC test (comparative) applied to an optical semiconductor device according to the conventional art.

PREFERRED MODES OF THE INVENTION

An optical semiconductor device according to examples of the present invention will now be described in detail with reference to the drawings. It goes without saying that other examples also fall within the scope of the claims as long as they are in line with the gist of the present invention.

Figure 1C:
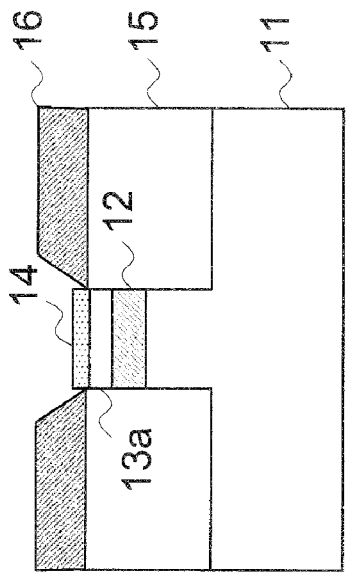
FIGS. 1A to 1D are diagrams useful in describing a method of manufacturing an optical semiconductor device according to an exemplary embodiment of the present invention.
Figure 1D:
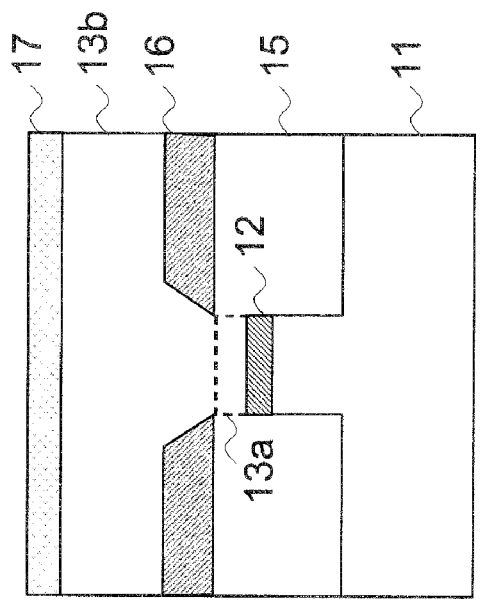
Figure 1A:
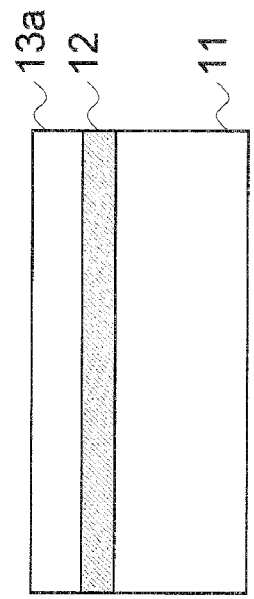
Figure 1B:
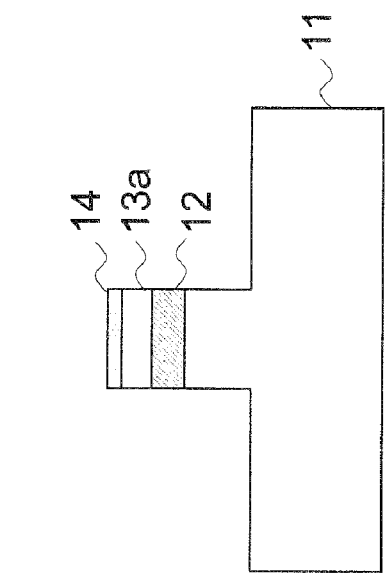
Figure 2:
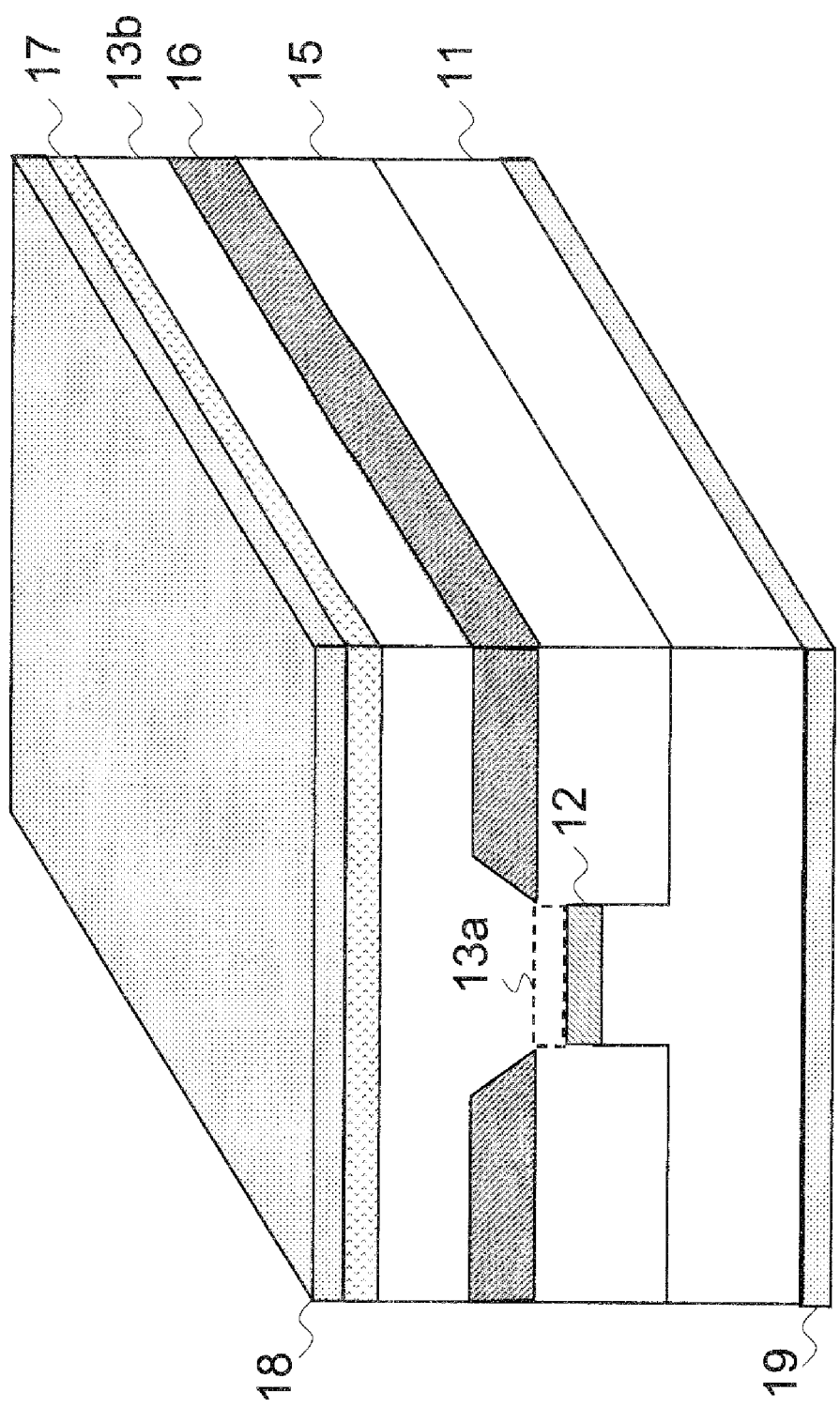
FIG. 2 is a perspective view illustrating the structure of an optical semiconductor device according to an exemplary embodiment of the present invention.

FIGS. 1A to 1D are diagrams useful in describing a method of manufacturing an optical semiconductor device according to an example of the present invention, and FIG. 2 is a perspective view illustrating the structure of an optical semiconductor device according to the example.

An optical semiconductor device according to the present invention has an optical waveguide structure comprising at least an n-type cladding layer 11, an active layer 12 and p-type cladding layers 13a, 13b, and a current narrowing/blocking structure comprising a p-type blocking layer 15 and an n-type blocking layer 16, wherein concentration of hydrogen contained in the p-type cladding layers is higher than concentration of hydrogen contained in the p-type blocking layer.

Further, it is preferred that the concentration of hydrogen contained in the p-type cladding layers 13a, 13b be two or more times greater than the concentration of hydrogen contained in the p-type blocking layer 15.

Further, the n-type cladding layer 11 and n-type blocking layer 16 may be n-type InP, and the p-type cladding layers 13a, 13b and p-type blocking layer 15 may be p-type InP.

The method of manufacturing the optical semiconductor device according to this example of the present invention includes steps of: forming a first layer structure, which includes the active layer 12 and first p-type cladding layer 13a, on the n-type cladding layer 11; forming a mesa structure by mesa-etching part of the first p-type cladding layer 13a, active layer 12 and n-type InP cladding layer 11; burying the mesa structure by forming a second layer structure having a current narrowing/blocking structure that includes the p-type blocking layer 15 and n-type blocking layer 16; and forming a third layer structure, which includes the second p-type cladding layer 13b, on the first p-type cladding layer 13a and current narrowing/blocking structure; wherein the concentration of hydrogen contained in the second p-type cladding layer 13b is made higher than the concentration of hydrogen contained in the p-type blocking layer 15.

Further, in the method of manufacture described above, the n-type InP substrate 11 and n-type blocking layer 16 may be n-type InP, and the first and second p-type cladding layers 13a, 13b and p-type blocking layer 15 may be p-type InP.

Furthermore, the first to third layer structures may be formed by Metal-Organic Vapor Phase Epitaxy (MOVPE).

Further, it is preferred that substrate temperature when supply of Group-V material gas is halted at the end of metal-organic vapor-phase growth of the second layer structure be higher than substrate temperature when supply of Group-V material gas is halted at the end of metal-organic vapor-phase growth of the third layer structure. Note the Group-V of elements is according to the international periodic table of IUPAC 1970.

Furthermore, it is preferred that the amount of Group-V material gas supplied from the end of metal-organic vapor-phase growth of the second layer structure until the supply of the Group-V material gas is halted be less than the amount of Group-V material gas supplied from the end of metal-organic vapor-phase growth of the third layer structure until the supply of the Group-V material gas is halted.

With reference to FIGS. 1A to 1D, the active layer 12 comprising InGaAsP or the like and the p-type InP cladding layer 13a are grown epitaxially on the n-type InP substrate 11 successively (FIG. 1A). Next, a dielectric mask 14 comprising $SiO_2$ or the like is formed in the shape of a stripe on the p-type InP cladding layer 13a and, using this as a mask, the p-type InP cladding layer 13a, active layer 12 and n-type InP substrate 11 are etched into a mesa stripe (FIG. 1B). Furthermore, a current blocking structure comprising a p-type InP blocking layer 15 and n-type InP blocking layer 16 is grown, burying the sides of the mesa stripe (FIG. 1C). After the dielectric mask 14 is removed, the p-type InP over-cladding layer 13b and a p-type InGaAs contact layer 17 are grown epitaxially (FIG. 1D).

FIG. 2 is a perspective view illustrating a structure of an optical semiconductor device according to this example of the invention.

As shown in FIG. 2, the optical semiconductor device is obtained by forming an n-side electrode 19 and p-side electrode 18 on a wafer that has been subjected to epitaxial growth in the manner described above. The hydrogen concentration of the p-type InP cladding layer 13b in this structure is set to be higher than that of the p-type blocking layer 15 (this shall be referred to as "structure A" below).

Various evaluation tests were conducted using a laser resonator length of 300 micrometers having front and rear end faces coated with 30% and 90% reflective films. The results are shown below. Further, an element having the conventional (comparative) structure (referred to as "structure B" below) was also fabricated and compared with structure A. In structure B, the hydrogen concentration of the p-type InP cladding layer 13b was set to be approximately equal to that of the p-type InP blocking layer 15.

Figure 12B:
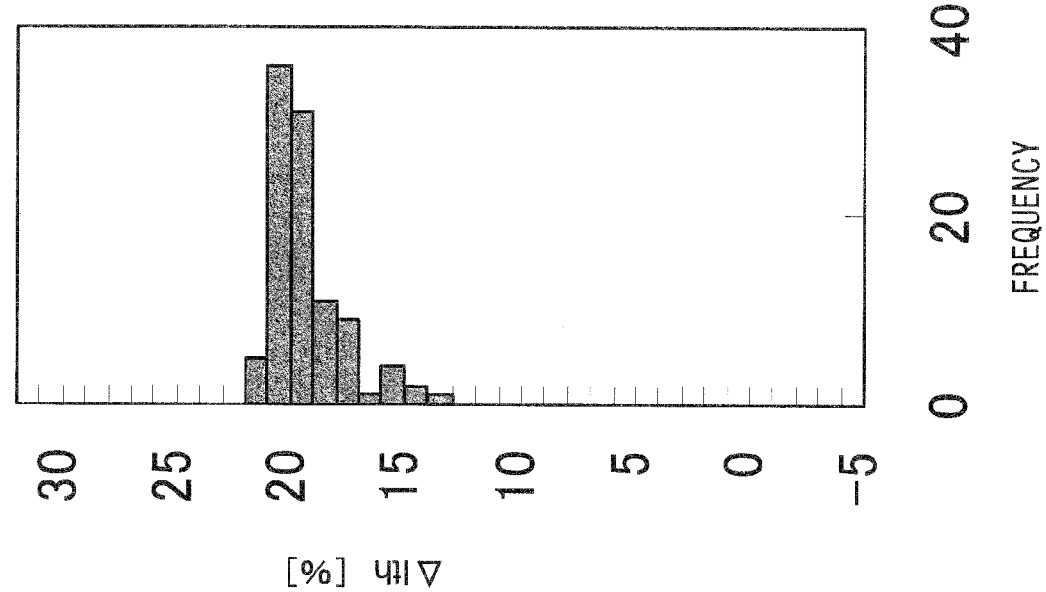
FIGS. 12A and 12B illustrate the results of an ACC test applied to an optical semiconductor device according to an exemplary embodiment of the present invention.
Figure 12A:
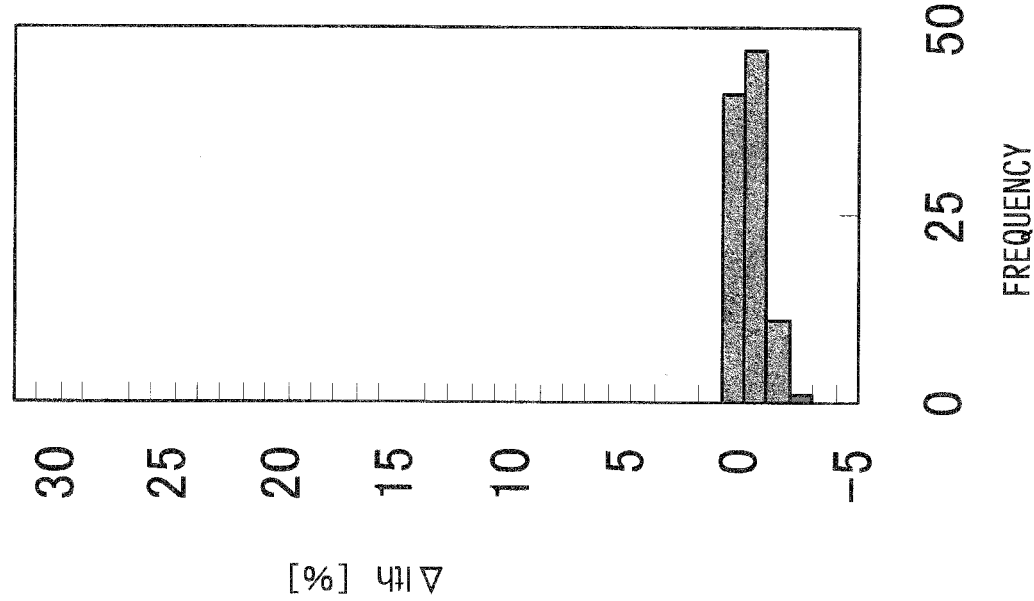

No significant difference in current vs. optical output characteristic or in current vs. voltage characteristic was observed between structure A of the optical semiconductor device according to the example of the present invention and structure B of the conventional optical semiconductor device. In order to evaluate reliability, an accelerated degradation test, in which a current is passed under ACC (Automatic Current Control), was conducted under high-temperature, high-bias conditions of 100 degrees C. and 200 mA, which are more severe than the actual driving conditions. When 100 elements having structure A and 100 elements having structure B were energized for 50 hours under the conditions of 100 degrees C. and 200 mA, distributions of a change (ΔIth) in oscillation threshold current (Ith) before and after energization were obtained and are as shown in FIGS. 12A and 12B. Specifically, FIG. 12A illustrates the Δ Ith distribution with regard to the elements having structure A according to this example of the invention, and FIG. 12B illustrates the Δ Ith distribution with regard to the elements having structure B according to the conventional art. It will be understood that with the elements having structure B, the average of Δ Ith is a large +20% (the oscillation threshold current is rising). With the elements having structure A of the present invention, on the other hand, it will be understood that Ith is decreasing (improving) although the average of ΔIth is −0.5%, which is very small.

Furthermore, in order to investigate long-term reliability, an APC (Automatic Power Control) test was conducted under high-temperature, high-output conditions of temperature 85 degrees C. and optical output 15 mW. The APC test is one that adjusts driving current automatically so as to hold optical output constant. Amount of change (ΔIop) in driving current (Iop) is monitored with respect to driving time.

Figure 13:
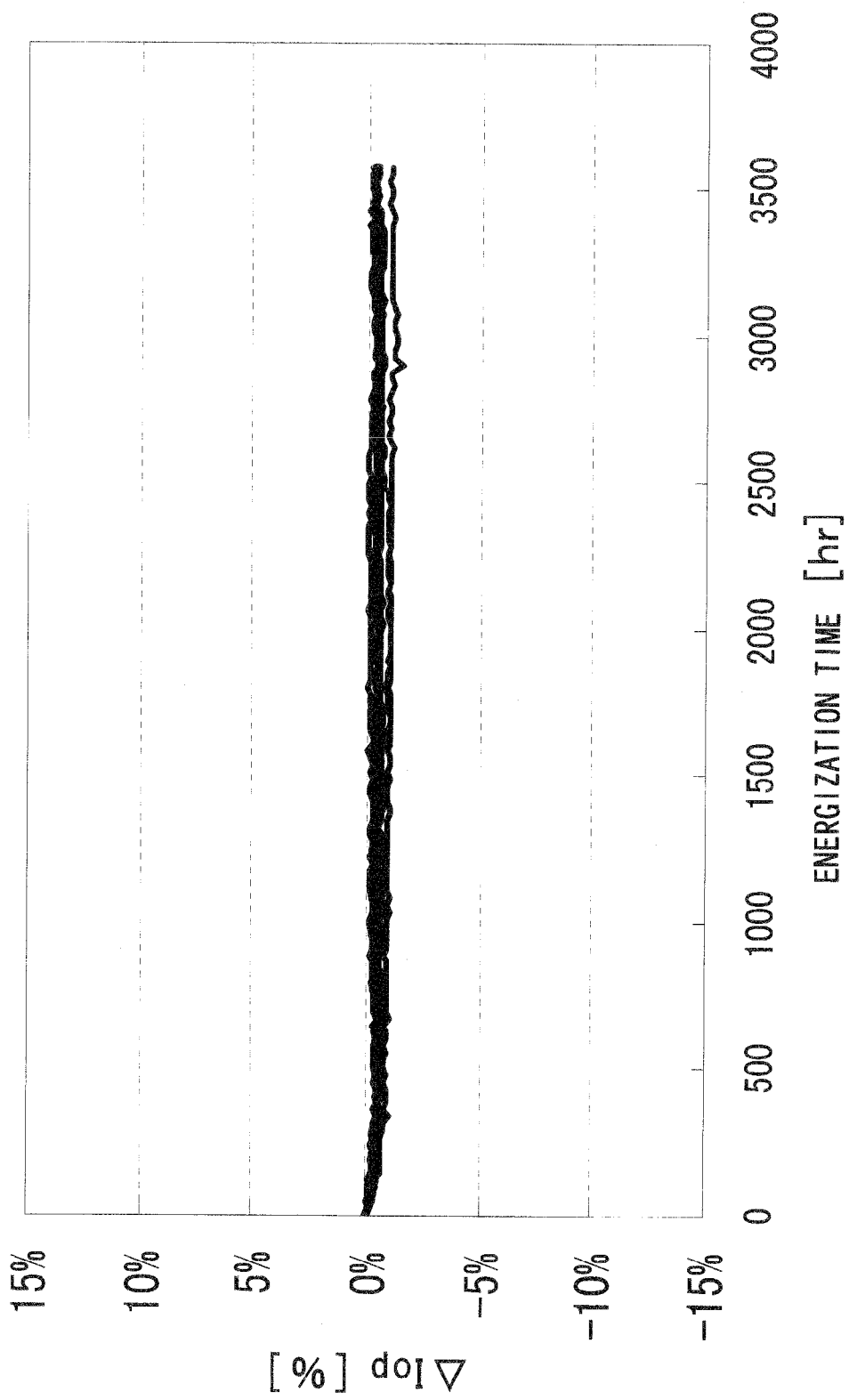
FIG. 13 illustrates the result of an APC test applied to an optical semiconductor device according to an exemplary embodiment of the present invention.

FIG. 13 illustrates the result of the APC test applied to the elements having structure A according to this example of the present invention. After Iop drops (improves) slightly at the beginning of energization, there is almost no change and Iop remains stable. On the other hand, FIG. 14 (comparative) illustrates the result of the APC test applied to the elements having structure B according to the conventional art. The driving current Iop increased with time and a rise in Iop of 5 to 10% was observed after elapse of 3500 hr.

Figure 3:
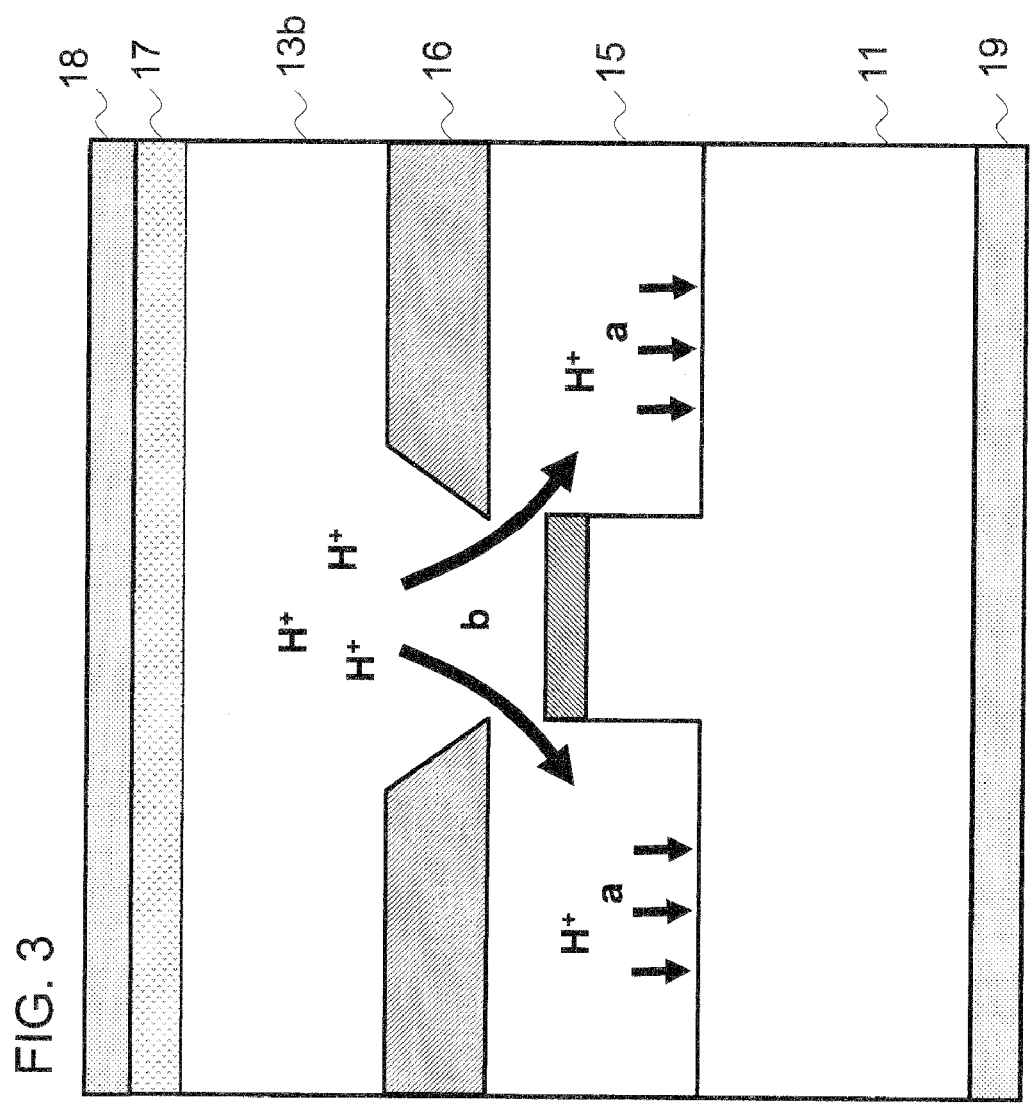
FIG. 3 is a diagram useful in describing the effects of an optical semiconductor device according to an exemplary embodiment of the present invention.

It was demonstrated from these test results that when average element lifetime is calculated under conditions of temperature 85 degrees C. and optical output 15 mW, structure A (FIG. 13) affords a high reliability of at least 300,000 hr, whereas the figure for structure B (FIG. 14) is 30,000 hr or less, which is a difference of more than one order of magnitude with regard to average element lifetime. The results of the above-described ACC test and APC test can be explained by the model of hydrogen migration in the p-type InP layer described earlier in conjunction with FIG. 3, and both tests indicate the effectiveness of the optical semiconductor device according to this example of the present invention.

FIRST EXAMPLE

An optical semiconductor device according to a first example of the present invention will now be described with reference to FIGS. 1 to 7.

An active layer 12, which is an InGaAsP/InGaAsP strained multiple quantum well (strained MQW), and a p-type InP cladding layer 13a are grown epitaxially on the n-type InP substrate 11 by MOVPE (FIG. 1A).

Next, a dielectric mask 14 of $SiO_2$ or the like is formed on the p-type InP cladding layer 13a in the shape of a stripe having a width of 1.5 micrometer, and the p-type InP cladding layer 13a, active layer 12 and n-type InP substrate 11 are dry-etched into the shape of a mesa stripe using the dielectric mask 14 as a mask (FIG. 1B).

Furthermore, the current blocking structure comprising a p-type InP blocking layer 15 and n-type InP blocking layer 16 is grown by MOVPE, thereby burying the sides of the mesa stripe (FIG. 1C). The p-type InP blocking layer 15 has a film thickness of 1.0 micrometer and a carrier concentration "p" of $1.0 \times 10^{18}$ cm$^{-3}$, and the n-type InP blocking layer 16 has a film thickness of 1.0 micrometer and a carrier concentration "n" of $1.0 \times 10^{18}$ cm$^{-3}$.

After the dielectric mask 14 is removed, a p-type InP overcladding layer 13b (having a film thickness of 2.5 micrometer and a carrier concentration p of $1.0 \times 10^{18}$ cm$^{-3}$) and the p-type InGaAs contact layer 17 (having a film thickness of 0.3 micrometer and a carrier concentration p of $8.0 \times 10^{18}$ cm$^{-3}$) are grown epitaxially (FIG. 1D).

A semiconductor laser structure shown in FIG. 2 is obtained by forming a p-side electrode 18 and n-side electrode 19 on the wafer that has been subjected to the epitaxial growth in the manner described above.

Figure 4:
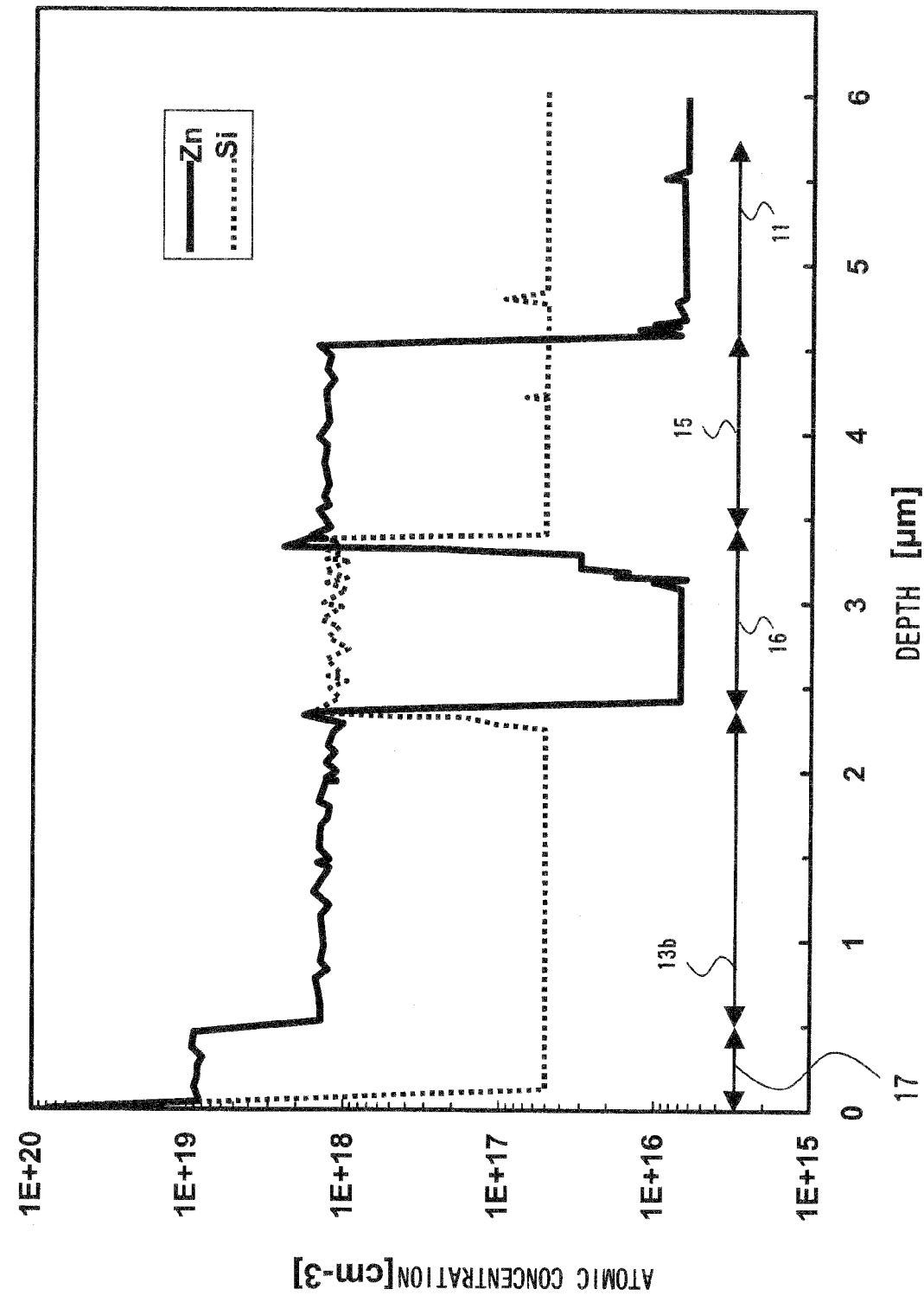
FIG. 4 is a dopant concentration profile in an optical semiconductor device according to exemplary embodiment of the present invention.

The wafer having the structure of FIG. 1D was subjected to analysis of dopant and hydrogen concentration by SIMS (Secondary Ion Mass Spectrometry). FIG. 4 is a depth-direction distribution of atomic concentrations of Zn, which is a p-type dopant, and Si, which is an n-type dopant. Here Zn has been detected in the p-type InP blocking layer 15, p-type InP cladding layer 13b and p-type InGaAs contact layer 17, and Si has been detected in the n-type InP blocking layer 16. There is agreement with the set carrier concentration except for Zn of the p-type InP blocking layer 15 and p-type InP cladding layer 13b. The atomic concentration of Zn in the p-type InP blocking layer 15 and p-type InP cladding layer 13b is $1.3 \times 10^{18}$ cm$^{-3}$. The reason why this is higher than carrier concentration $p=1.0 \times 10^{18}$ cm$^{-3}$ is that the acceptor has been compensated for by the existence of hydrogen (hydrogen passivation). A hydrogen concentration of $3.0 \times 10^{17}$ cm$^{-3}$, which is equivalent to the difference with respect to carrier concentration, has been confirmed by the SIMS analysis, as illustrated in FIG. 5.

Figure 5:
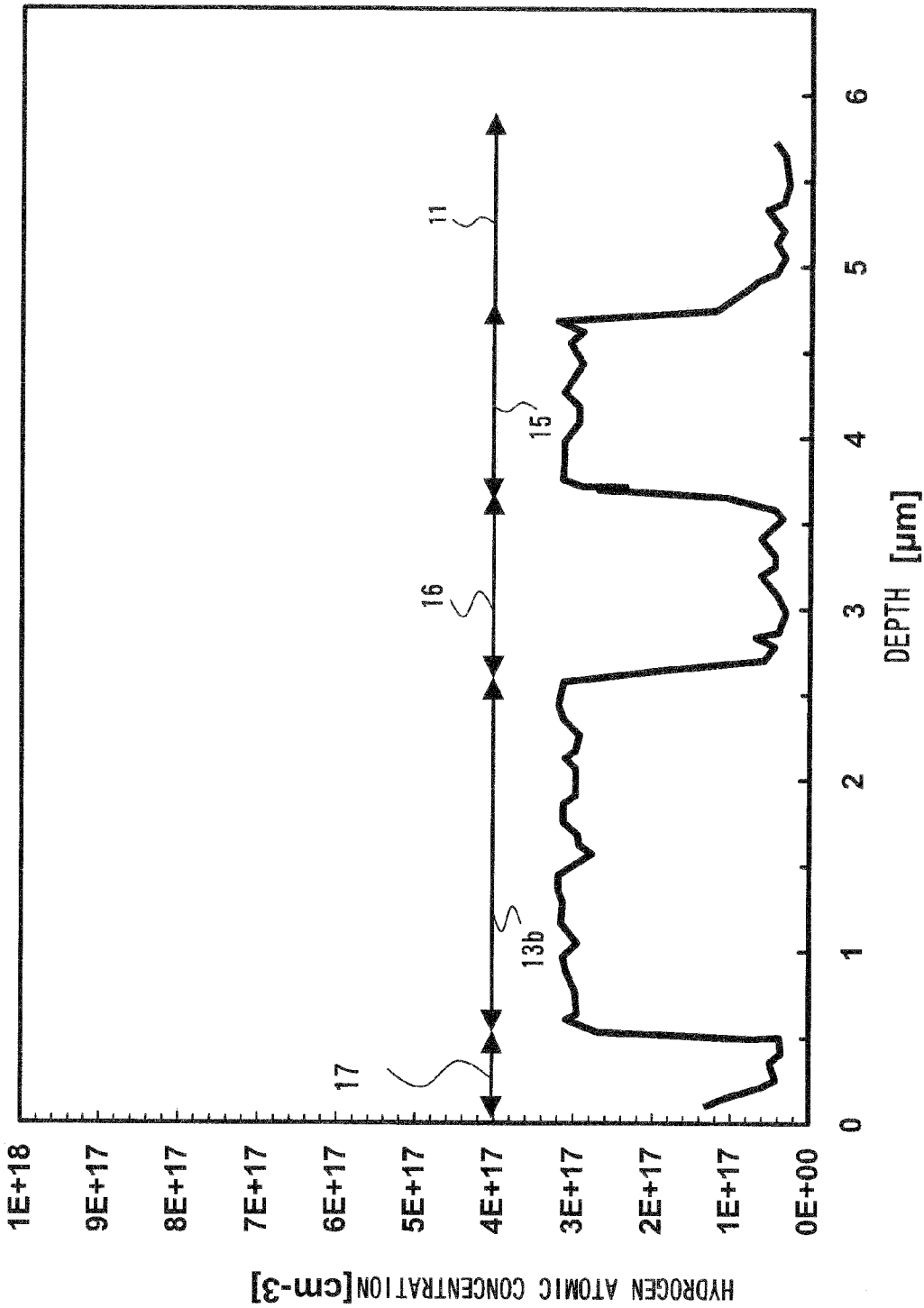
FIG. 5 is a hydrogen concentration profile (comparative) in an optical semiconductor device according to a conventional art.

The hydrogen concentration profile of FIG. 5 is for a case where the p-type InP blocking layer 15 and p-type InP cladding layer 13b are the result of crystal growth under the same conditions and corresponds to the conventional structure (structure B).

Figure 6:
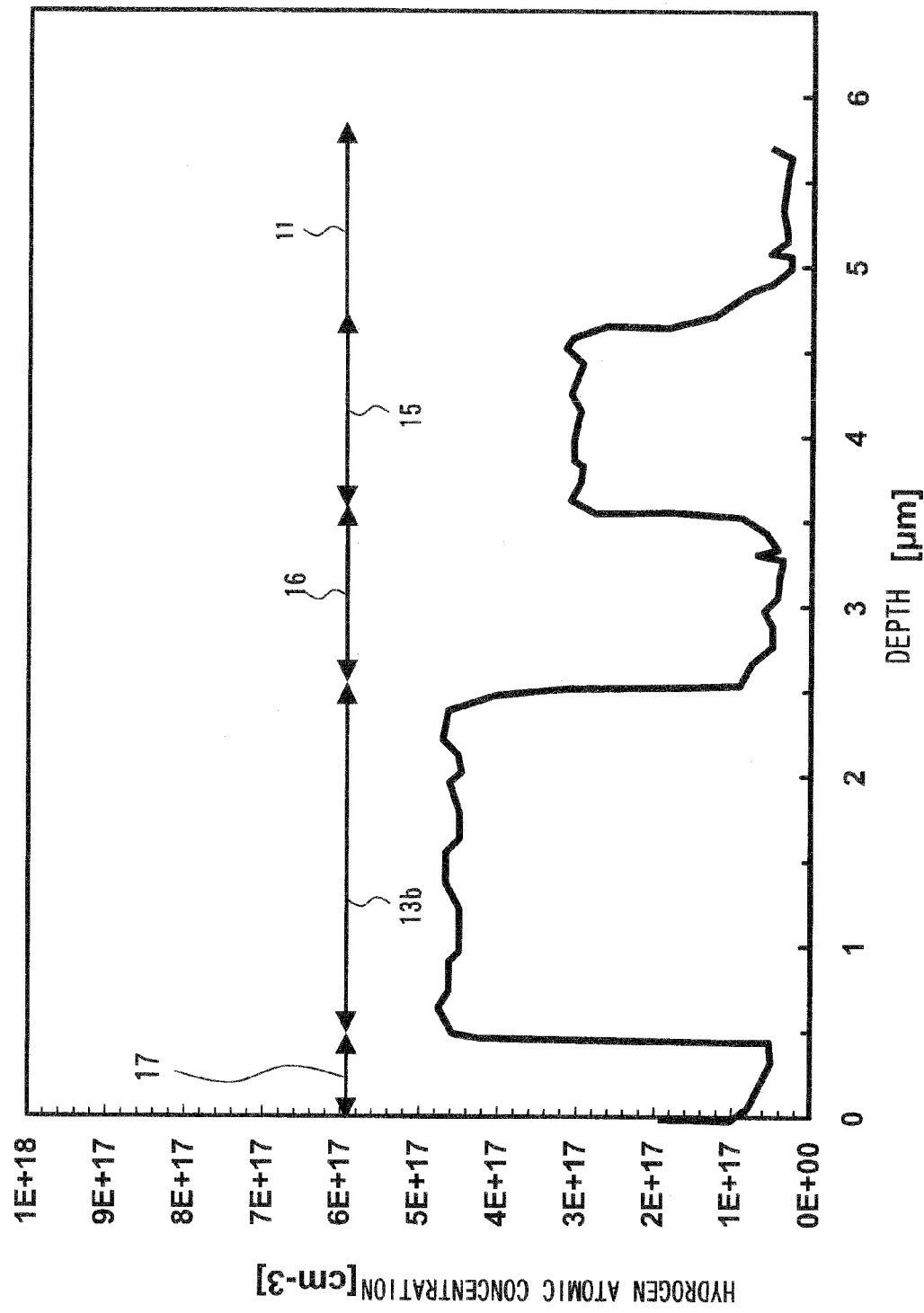
FIG. 6 is a hydrogen concentration profile in an optical semiconductor device according to a first example of the present invention.

On the other hand, FIG. 6 is a hydrogen concentration profile in an optical semiconductor device according to the first example of the present invention. The hydrogen concentration of the p-type InP cladding layer 13b $4.5 \times 10^{17}$ cm$^{-3}$, which is a higher than that of the p-type InP blocking layer 15.

A method of thus making the hydrogen concentration of the p-type InP cladding layer 13b higher than that of the p-type InP blocking layer 15 will be described with reference to FIG. 7.

Figure 7:
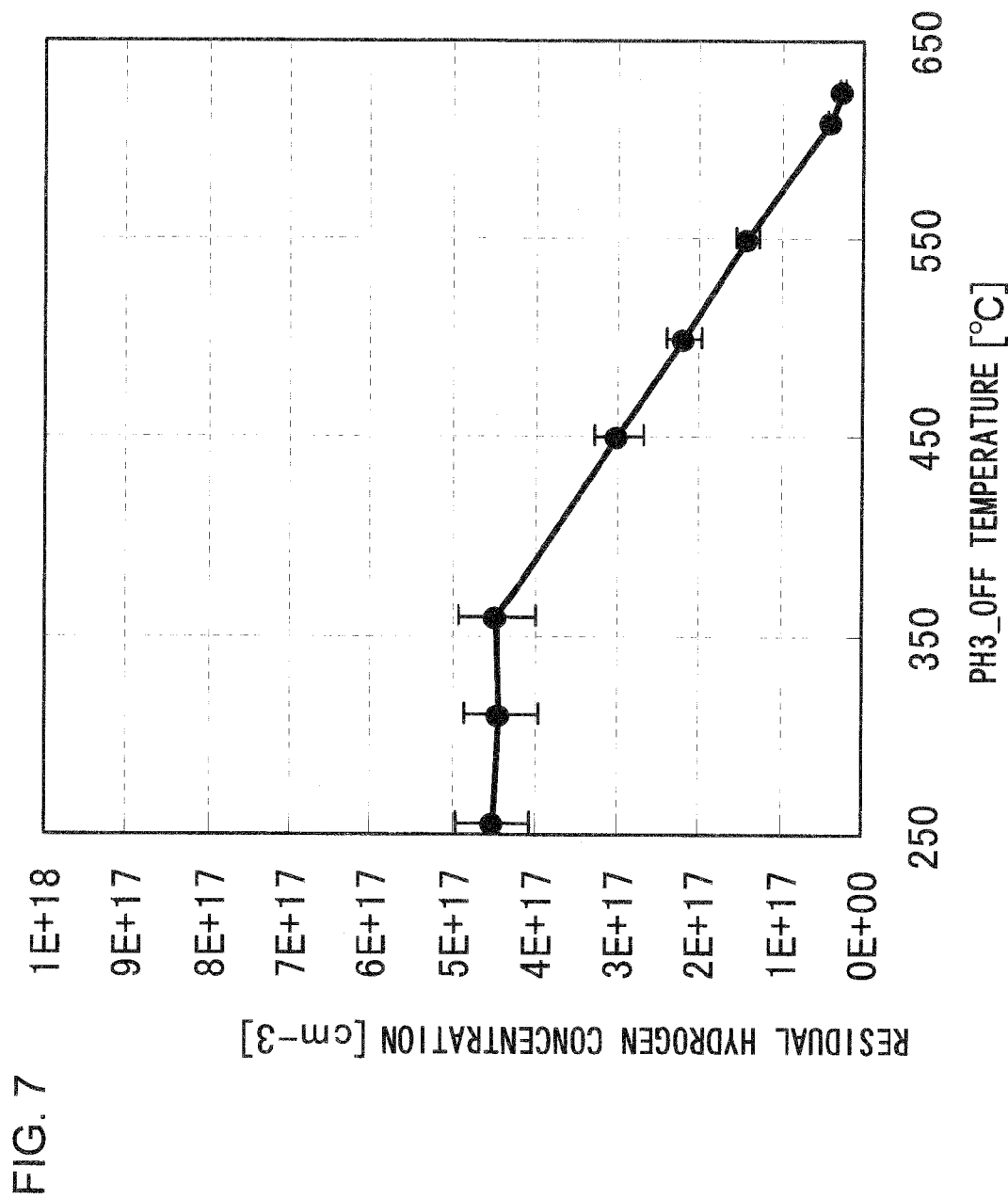
FIG. 7 is a crystal-growth characteristic diagram of the optical semiconductor device according to the first example.

FIG. 7 is a graph obtained by investigating the relationship between substrate temperature and concentration of hydrogen that remains in the p-type InP layers. The substrate temperature is that at which supply of phosphine (PH3), which is a Group-V raw-material gas, at temperature-drop standby following the end of crystal growth of the p-type InP layers by MOVPE is halted. An experiment was conducted upon fixing the amount of flow of PH3 supplied to 150 ccm. When supply of PH3 is halted at a high substrate temperature, hydrogen that has been taken into the crystal is released. On the other hand, since PH3, which is the supply source of hydrogen, is absent at this time, residual hydrogen concentration declines. On the basis of this relationship, when the p-type InP blocking layer 15 is grown (formed), the temperature at which the supply of PH3 is halted during temperature-drop standby following the end of crystal growth is made 450 degrees C., whereas in the case of the p-type InP cladding layer 13*b*, this temperature is made 350 degrees C. or less. As a result, the hydrogen concentration of the p-type InP cladding layer 13*b* can be made higher than that of the p-type InP blocking layer 15.

SECOND EXAMPLE

An optical semiconductor device according to a second example of the present invention will now be described with reference to FIGS. 8 and 9.

In the optical semiconductor device according to this example, the hydrogen concentration of the p-type InP cladding layer 13*b* is raised further and is made two or more times greater than the hydrogen concentration of the p-type InP blocking layer 15.

The amount of PH3 to be supplied is increased during the temperature-drop standby. This is made in addition to the lowering of temperature at halting of the PH3 supply during temperature-drop standby following the end of growth in the first example. As a result, the concentration of hydrogen evolved by decomposition of PH3 can be raised and the residual hydrogen concentration in the p-type InP layers can be increased.

Figure 8:
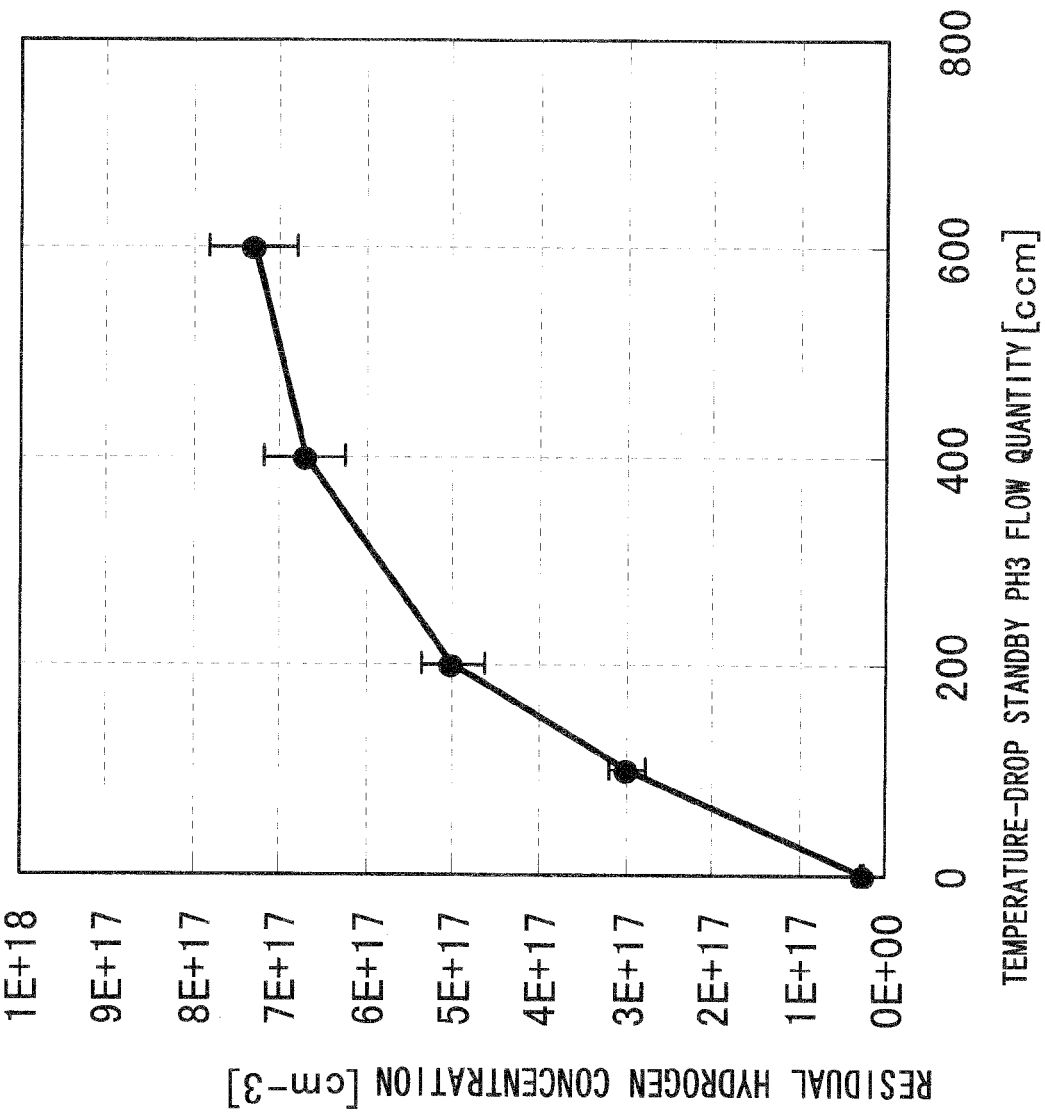
FIG. 8 is a crystal-growth characteristic diagram of the optical semiconductor device according to a second example of the present invention.
Figure 10C:
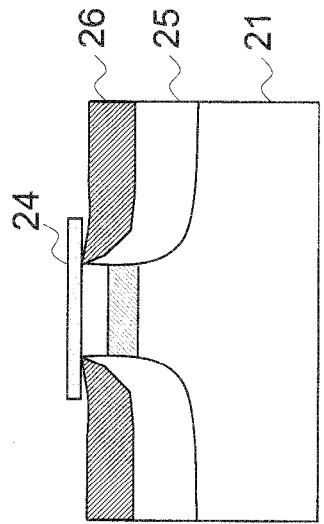
FIGS. 10A to 10D are diagrams useful in describing a method of manufacturing an optical semiconductor device according to the conventional art.
Figure 10D:
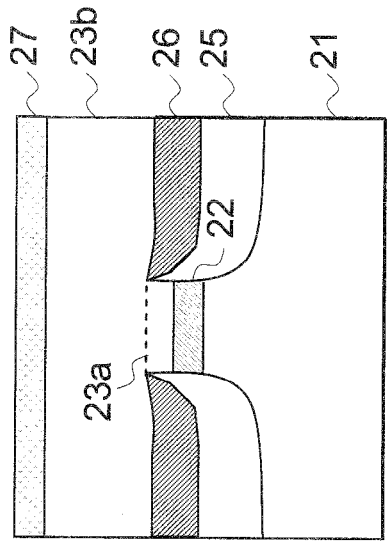
Figure 10A:
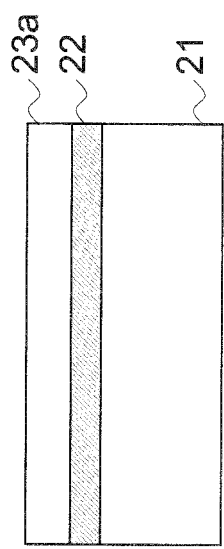
Figure 10B:
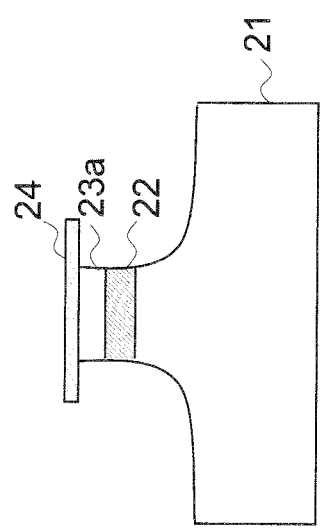
Figure 11:
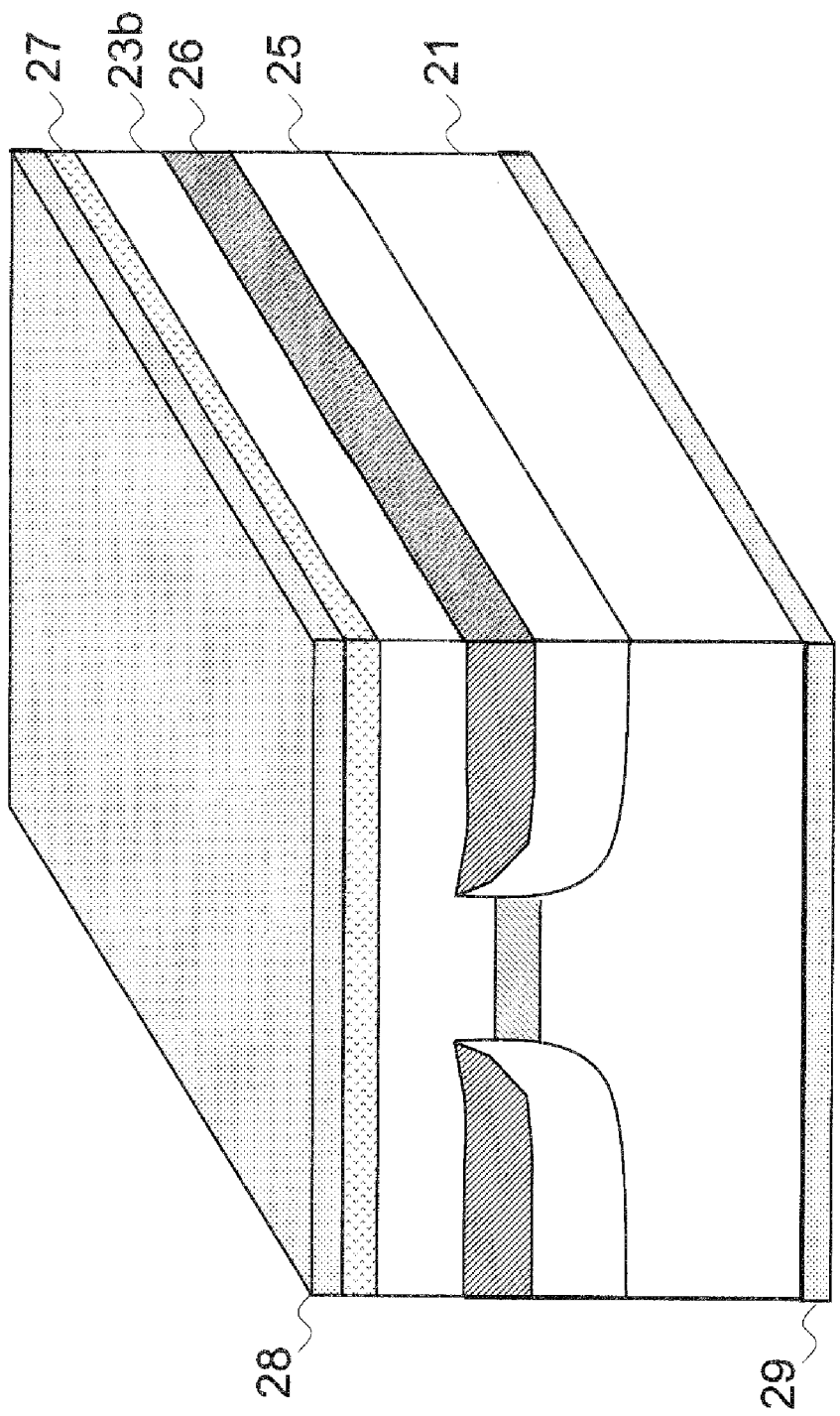
FIG. 11 is a perspective view illustrating the structure of an optical semiconductor device according to the conventional art.

FIG. 8 illustrates results obtained by investigating the relationship between amount of flow of PH3 supplied, with temperature at halting of the PH3 supply during temperature-drop standby being fixed at 300 degrees C., and the residual hydrogen concentration. The hydrogen concentration of the p-type InP layers rises as the amount of flow of supplied PH3 is increased, as illustrated in FIG. 8. A laser structure was fabricated with the standby amount of flow of PH3 following the end of growth of the p-type InP blocking layer 15 being made 150 ccm and the standby amount of flow of PH3 following the end of growth of the p-type InP cladding layer 13*b* being made 400 ccm, and the result of investigating the residual hydrogen profile by SIMS analysis is shown in FIG. 9. It will be understood that while the hydrogen concentration of the p-type InP blocking layer 15 is $3.0 \times 10^{17}$ cm$^{-3}$, which is the same as in the first example, the hydrogen concentration of the p-type InP cladding layer 13*b* has been raised to $6.5 \times 10^{17}$ cm$^{-3}$, which is more than twice as high.

Electrodes were formed on the wafer thus subjected to crystal growth to thereby obtain the semiconductor laser structure shown in FIG. 2. The laser resonator length was made 300 micrometers and the front and rear end faces were coated with 30% and 90% reflective films. An ACC test under conditions of 100 degrees C., 200 mA and 50 hr and an APC test under conditions of 85 degrees C., 15 mW and 3500 hr were conducted.

FIG. 12A illustrates the rate of change ($\Delta$ Ith) in oscillation threshold current before and after the ACC test, and FIG. 13 illustrates the time trend of rate of change ($\Delta$Iop) in driving current evaluated in the APC test. All of the results were excellent, and an estimated average lifetime of at least 200,000 hours was obtained even under high-temperature, high-output conditions of 85 degrees C. and 15 mW.

Although only an InGaAsP/InP-group buried hetero-structure semiconductor laser has been described in the foregoing examples, the invention is not limited to this group of materials. As long as the structure is such that migration of hydrogen occurs between the p-type blocking layer structure and the p-type cladding structure, the invention is applicable to any material and structure. Further, the invention is not limited to a semiconductor laser and can be applied to all types of buried optical semiconductor devices such as a semiconductor optical amplifier and modulator-integrated semiconductor laser.

Further, although the description of the present invention has been rendered based upon the examples, the present invention is not limited to these examples.

As many apparently widely different examples of the present invention can be made without departing from the spirit and scope thereof, it is to be understood that the invention is not limited to the specific examples thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An optical semiconductor device comprising:
   an optical waveguide structure comprising an n-type cladding layer, an active layer and a p-type cladding layer; and
   a current narrowing/blocking structure comprising a p-type blocking layer and an n-type blocking layer;
   wherein said p-type cladding layer has a higher concentration of hydrogen than the concentration of hydrogen contained in said p-type blocking layer.

2. The device according to claim 1, wherein the concentration of hydrogen contained in said p-type cladding layer is two or more times greater than the concentration of hydrogen contained in said p-type blocking layer.

3. The device according to claim 1, wherein said n-type cladding layer and said n-type blocking layer are n-type InP, and said p-type cladding layer and said p-type blocking layer are p-type InP.

* * * * *